United States Patent
Choi et al.

(10) Patent No.: US 9,887,164 B2
(45) Date of Patent: Feb. 6, 2018

(54) SEMICONDUCTOR PACKAGE AND SEMICONDUCTOR DEVICE INCLUDING AN ELECTROMAGNETIC WAVE SHIELDING MEMBER

(71) Applicant: SAMSUNG ELECTRONICS CO., LTD., Suwon-si, Gyeonggi-Do (KR)

(72) Inventors: Jae-Hoon Choi, Cheonan-si (KR); Dong-Woo Shin, Cheonan-si (KR); Chang-Yong Park, Cheonan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/417,338

(22) Filed: Jan. 27, 2017

(65) Prior Publication Data

US 2017/0229400 A1    Aug. 10, 2017

(30) Foreign Application Priority Data

Feb. 4, 2016 (KR) .................. 10-2016-0014081

(51) Int. Cl.
*H01L 23/552* (2006.01)
*H01L 23/00* (2006.01)
*H01L 23/31* (2006.01)

(52) U.S. Cl.
CPC ........ *H01L 23/552* (2013.01); *H01L 23/3121* (2013.01); *H01L 24/08* (2013.01); *H01L 24/16* (2013.01); *H01L 2924/3025* (2013.01)

(58) Field of Classification Search
CPC ... H01L 23/552; H01L 23/3121; H01L 24/08; H01L 24/16; H01L 2924/3025
See application file for complete search history.

(56) References Cited

U.S. PATENT DOCUMENTS

| | | | |
|---|---|---|---|
| 6,930,891 B1 | 8/2005 | Hama et al. | |
| 7,463,496 B2 | 12/2008 | Robinson et al. | |
| 8,279,624 B2 | 10/2012 | Crotty | |
| 2004/0231879 A1* | 11/2004 | Ebihara | H01L 23/552 174/521 |
| 2005/0219832 A1* | 10/2005 | Pawlenko | H05K 5/0013 361/818 |

(Continued)

FOREIGN PATENT DOCUMENTS

| | | |
|---|---|---|
| JP | 2002-289753 | 10/2002 |
| KR | 10029394 | 4/2001 |

(Continued)

*Primary Examiner* — Yasser A Abdelaziez
(74) *Attorney, Agent, or Firm* — F. Chau & Associates, LLC (57) ABSTRACT

A semiconductor package includes a semiconductor chip mounted on a substrate. The semiconductor package further includes an electromagnetic wave shielding member. The electromagnetic wave shielding member includes an upper surface and a plurality of side surfaces. The electromagnetic wave shielding member surrounds an upper surface and side surfaces of the semiconductor chip. The semiconductor package further includes a hooking member formed from a deformation of a lower end of one of the side surfaces of the electromagnetic wave shielding member. The hooking member is interposed between the semiconductor chip and the substrate to fix the electromagnetic wave shielding member.

20 Claims, 7 Drawing Sheets

(56) References Cited

U.S. PATENT DOCUMENTS

| | | | |
|---|---|---|---|
| 2006/0158857 A1* | 7/2006 | Luckner | H01L 23/3675 361/719 |
| 2007/0176272 A1* | 8/2007 | Saitoh | B81B 7/0061 257/679 |
| 2007/0263373 A1 | 11/2007 | Chen et al. | |
| 2008/0043453 A1* | 2/2008 | Horng | H05K 9/0028 361/818 |
| 2012/0238058 A1* | 9/2012 | Luo | H01L 23/16 438/111 |
| 2013/0329381 A1 | 12/2013 | Huang et al. | |
| 2014/0334119 A1 | 11/2014 | Ho | |

FOREIGN PATENT DOCUMENTS

| | | |
|---|---|---|
| KR | 1020100129559 | 12/2010 |
| KR | 1020150086012 | 7/2015 |

* cited by examiner

SEMICONDUCTOR PACKAGE AND SEMICONDUCTOR DEVICE INCLUDING AN ELECTROMAGNETIC WAVE SHIELDING MEMBER

CROSS-REFERENCE TO RELATED APPLICATION

This application claims priority under 35 U.S.C. § 119 to Korean Patent Application No. 10-2016-0014081, filed on Feb. 4, 2016, in the Korean Intellectual Property Office, the disclosure of which is incorporated by reference herein in its entirety.

TECHNICAL FIELD

Exemplary embodiments of the present inventive concept relate to a semiconductor package and a semiconductor device, and more particularly, to a semiconductor package and a semiconductor device including an electromagnetic wave shielding member.

DISCUSSION OF THE RELATED ART

A semiconductor chip or package generates an electromagnetic wave that may cause signal interference in a device using them, such as a mobile phone or laptop. To prevent the signal interference, the semiconductor chip or package may be covered by a shielding member.

SUMMARY

According to an exemplary embodiment of the present inventive concept, a semiconductor package includes a semiconductor chip mounted on a substrate. The semiconductor package further includes an electromagnetic wave shielding member. The electromagnetic wave shielding member includes an upper surface and a plurality of side surfaces. The electromagnetic wave shielding member surrounds an upper surface and side surfaces of the semiconductor chip. The semiconductor package further includes a hooking member formed from a deformation of a lower end of one of the side surfaces of the electromagnetic wave shielding member. The hooking member is interposed between the semiconductor chip and the substrate to fix the electromagnetic wave shielding member.

According to an exemplary embodiment of the present inventive concept, a semiconductor device includes a semiconductor package including a semiconductor chip. The semiconductor device further includes a first substrate. The first substrate includes a grounding pad in an upper surface thereof. Further, the semiconductor package is mounted on the first substrate. The semiconductor device further includes an electromagnetic wave shielding member including an upper surface and a plurality of side surfaces. The electromagnetic wave shielding member surrounds an upper surface and side surfaces of the semiconductor package. The side surfaces of the electromagnetic wave shielding member surround side surfaces of the semiconductor chip. Further, a portion of the electromagnetic wave shielding member includes a split between the side surfaces of the electromagnetic wave shielding member. The electromagnetic wave shielding member further includes a hooking member interposed between the semiconductor package and the first substrate and configured to fix the electromagnetic wave shielding member.

According to an exemplary embodiment of the present inventive concept, a semiconductor package includes a substrate, a bump disposed on the substrate, and a semiconductor chip disposed on the bump. The semiconductor package further includes an electromagnetic wave shielding member enclosing the semiconductor chip. The electromagnetic wave shielding member includes a bent lower end of at least one side surface of the electromagnetic wave shielding member. The bent lower end includes a bend overlapping a bottom portion of the semiconductor chip. The electromagnetic wave shielding member further includes a space between adjacent side surfaces of the electromagnetic wave shielding member.

BRIEF DESCRIPTION OF THE DRAWINGS

Exemplary Embodiments of the present inventive concept will be more clearly understood by describing in detail exemplary embodiments thereof with reference to the accompanying drawings, in which.

DETAILED DESCRIPTION OF THE EMBODIMENTS

Figure 1A:
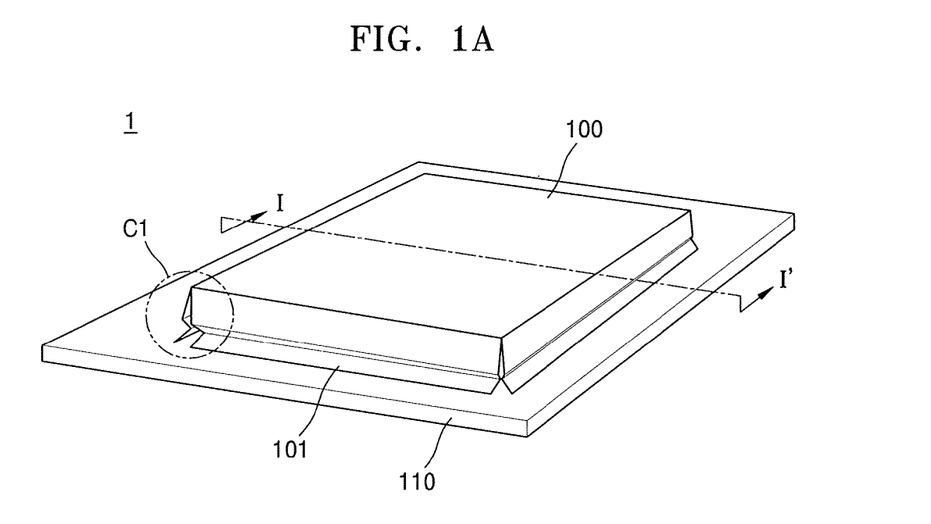
FIG. 1A is a perspective view illustrating a semiconductor package according to an exemplary embodiment of the present inventive concept.
Figure 1B:
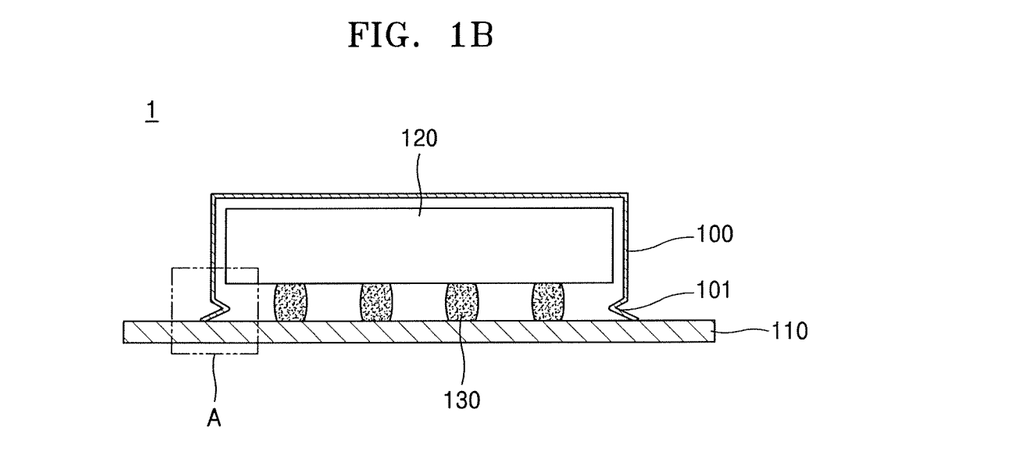
FIG. 1B is a cross-sectional view, taken along a line I-I' of FIG. 1A, illustrating a semiconductor package according to an exemplary embodiment of the present inventive concept.

FIG. 1A is a perspective view illustrating a semiconductor package 1 according to an exemplary embodiment of the present inventive concept. FIG. 1B is a cross-sectional view, taken along a line I-I' of FIG. 1A, illustrating the semiconductor package 1 according to an exemplary embodiment of the present inventive concept.

Referring to FIGS. 1A and 1B, the semiconductor package 1 may include a semiconductor chip 120, a package substrate 110 on which the semiconductor chip 120 is mounted, and an electromagnetic wave shielding member 100 surrounding an upper surface and side surfaces of the semiconductor chip 120, and contacting the package substrate 110, according to an exemplary embodiment of the present inventive concept.

Furthermore, the semiconductor package 1 may further include a bump 130 electrically connecting the semiconductor chip 120 and the package substrate 110. Here, the electromagnetic wave shielding member 100 may be spaced apart from the bump 130. For example, there may be a space between a bump 130 adjacent to an end of the semiconductor chip 120 and the electromagnetic wave shielding member 100.

The electromagnetic wave shielding member 100 may include a hooking member 101 which is a deformation of a lower end of one of the side surfaces of the electromagnetic wave shielding member 100. For example, the hooking member 101 may be a bent lower end. However, exemplary embodiments of the present inventive concept are not limited to the deformation of the lower end of one the side surfaces of the electromagnetic wave shielding member 100. For example, there may be a deformation of the lower end of all side surfaces of the electromagnetic wave shielding member 100. The hooking member 101 may be interposed between the semiconductor chip 120 and the package substrate 110 with space between one another so that the hooking member 101 may fix the electromagnetic wave shielding member 100. For example, the hooking member may secure the electromagnetic wave shielding member 100 to the package substrate 110.

The package substrate 110, for example, may be a printed circuit board (PCB). The PCB may be a single-sided PCB or a double-sided PCB, or may be a multi-layer PCB including at least one internal wiring pattern in a substrate. Furthermore, the package substrate 110 may be a rigid PCB or a flexible PCB.

In exemplary embodiments of the present inventive concept, the package substrate 110 may include, for example, an epoxy resin, a polyimide resin, a bismaleimide triazine (BT) resin, Flame Retardant 4 (FR-4), FR-5, ceramics, silicon, glass, photosensitive liquid dielectrics, photosensitive dry-film dielectrics, polyimide flexible film thermally cured dry films, thermally cured liquid dielectrics, a resin coated copper foil (RCC), thermoplastics, or a flexible resin.

In exemplary embodiments of the present inventive concept, the package substrate 110 may be formed by adhering a plurality of rigid flat panels together or by adhering a thin flexible PCB and a rigid flat panel together. The plurality of rigid flat panels adhered to one another or to PCBs may respectively include wiring patterns. Furthermore, the package substrate 110 may include a low temperature co-fired ceramic (LTCC) substrate. A plurality of ceramic layers may be laminated on the LTCC substrate and may include wiring patterns.

The package substrate 110 may include at least one insulating layer and metal wiring layer. The metal wiring layer, which is a circuit pattern formed in the package substrate 110, may be formed of, for example, aluminum (Al) or copper (Cu). In exemplary embodiments of the present inventive concept, a surface of the metal wiring layer may be plated with tin (Sn), gold (Au), nickel (Ni), or lead (Pb).

The package substrate 110 may include a conductive pad electrically connecting the semiconductor chip 120 and the package substrate 110 via the bump 130. For example, the conductive pad may be disposed on an upper surface of the package substrate 110. The package substrate 110 may further include a solder ball pad including a solder ball electrically connecting the semiconductor package 1 and an external circuit. For example, the solder ball pad may be disposed on a lower surface of the package substrate 110. The conductive pad and the solder ball pad, for example, may be formed of Al or Cu. In exemplary embodiments of the present inventive concept, a surface of the conductive pad and the solder ball pad may be plated with Sn, Au, Ni, or Pb. The package substrate 110 may further include a penetrating contact electrically connecting the conductive pad and the solder ball pad via an upper surface and a lower surface of the package substrate 110. For example, the penetrating contact may penetrate through the upper surface and lower surface of the package substrate 110 to electrically connect the conductive pad and the solder ball pad.

The semiconductor chip 120 of FIG. 1B may be mounted on the package substrate 110 by using a flip-chip bonding method, but a method of mounting the semiconductor chip 120 is not limited thereto. For example, the semiconductor chip 120 may be mounted on the package substrate 110 by using a wire-bonding method.

A semiconductor substrate forming the semiconductor chip 120 may include, for example, silicon (Si). In addition, a semiconductor substrate forming the semiconductor chip 120 may include a semiconductor element such as germanium (Ge) or a compound semiconductor such as silicon carbide (SiC), gallium arsenide (GaAs), indium arsenide (InAs), and indium phosphide (InP). In addition, a semiconductor substrate forming the semiconductor chip 120 may include a silicon on insulator (SOI) structure. For example, a semiconductor substrate forming the semiconductor chip 120 may include a buried oxide (BOX) layer. A semiconductor substrate forming the semiconductor chip 120 may include a conductive region, for example, a well doped with impurities. A semiconductor substrate forming the semiconductor chip 120 may include various element isolation structures such as a shallow trench isolation (STI) structure.

A semiconductor device may include various kinds of individual devices that may be formed in the semiconductor chip 120. The individual devices may include various microelectronic devices, for example, a metal-oxide-semiconductor field effect transistor (MOSFET) such as a complementary metal-insulator-semiconductor (CMOS) transistor. Another example of a microelectronic device is an image sensor such as a system of a large scale integration (LSI) and a CMOS imaging sensor (CIS). Additional examples of microelectronic devices include a micro-electro-mechanical system (MEMS), an active device, or a passive device. The individual devices may be electrically connected to the conductive region of the semiconductor substrate forming the semiconductor chip 120. The semiconductor device may further include at least two of the individual devices, or a conductive wiring or a conductive plug electrically connecting the individual devices and the conductive region of the semiconductor substrate forming the semiconductor chip 120. Furthermore, the individual devices may be electrically divided from neighboring other individual devices by an insulating film, respectively.

The semiconductor chip 120 may be, for example, a semiconductor memory chip. The semiconductor memory chip may be, for example, a semiconductor volatile memory chip such as a Dynamic Random Access Memory (DRAM)

or a static Random Access Memory (SRAM). In addition, the semiconductor memory chip may be, for example, a semiconductor nonvolatile memory chip such as a Phase-change Random Access Memory (PRAM), a Magnetoresistive Random Access Memory (MRAM), a Ferroelectric Random Access Memory (FeRAM) or a Resistive Random Access Memory (RRAM).

The electromagnetic wave shielding member 100 may be formed of a metal material. For example, the electromagnetic wave shielding member 100 may be formed of a conductive metal material such as steel use stainless (SUS) or Al. The electromagnetic wave shielding member 100 may include an upper surface including a size corresponding to that of the semiconductor chip 120, and side surfaces formed along an edge of the upper surface and providing a constant height. For example, the upper surface of the shielding member 100 may be a size slightly larger than an upper surface of the semiconductor chip 120 to cover the semiconductor chip 120. Further, in the example, the side surfaces may extend from along an edge of the upper surface to come in contact with the package substrate 110 and has a height slightly larger than a height of the semiconductor chip 120. The hooking member 101, which is bent inside the semiconductor chip 120, may be located at the lower end of one of the side surfaces of the electromagnetic wave shielding member 100.

A part C1 of the side surfaces of the electromagnetic wave shielding member 100, in which the side surfaces surround side surfaces of the semiconductor chip 120, may be split. For example, there may be a gap or space between each side surface of the electromagnetic wave shielding member 100. This facilitates assembly of the electromagnetic wave shielding member 100 to the semiconductor package 1 since the electromagnetic wave shielding member 100 may extend in a horizontal direction. For example, as illustrated in FIG. 1A, the upper surface of the electromagnetic wave shielding member 100 disposed over the semiconductor chip 120 is square shaped (e.g., a polygonal shape). In addition, the electromagnetic wave shielding member 100 may include the split C1 between adjacent side surfaces among the four side surfaces extending from the edges of the upper surface of the electromagnetic wave shielding member 100. Further, the four side surfaces are connected to the upper surface of the electromagnetic wave shielding member 100. However, the present inventive concept is not limited thereto. For example, the upper surface of the electromagnetic wave shielding member 100 may be similar to a rectangle and may include side surfaces extending from the edges of the upper surface of the electromagnetic wave shielding member 100.

Figure 2:
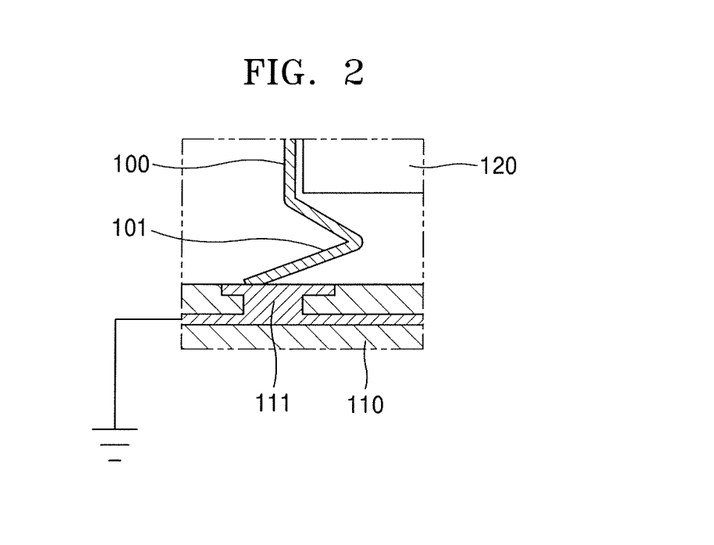
FIG. 2 is a cross-sectional view, of an enlarged A region of FIG. 1B, illustrating a hooking member of an electromagnetic wave shielding member of a semiconductor package, according to an exemplary embodiment of the present inventive concept.

FIG. 2 is a cross-sectional view, enlarged with an A region of FIG. 1B, illustrating the hooking member 101 of the electromagnetic wave shielding member 100 of the semiconductor package 1, according to an exemplary embodiment of the present inventive concept.

Referring to FIG. 2, the hooking member 101 of the electromagnetic wave shielding member 100 may contact a ground region 111 exposed from an upper surface of the package substrate 110. For example, a lower section of the hooking member 101 extending from the bend may be in contact with the ground region. Further, the lower section may form an angle with the ground region that is greater than zero. In addition, the grounding region 111 may be within the package substrate 110 and extends to the upper surface of the package substrate 110. A grounding pattern of the ground region 111 may be exposed by exposing a part of the upper surface of the package substrate 110. The ground region 111 may be electrically connected to a solder ball pad, to which a grounded solder ball is attached, via a penetrating contact of the package substrate 110. Accordingly, the electromagnetic wave shielding member 100 may further be connected to a ground terminal outside the semiconductor package. Thus, electromagnetic wave shielding performance may be further improved.

Figure 3:
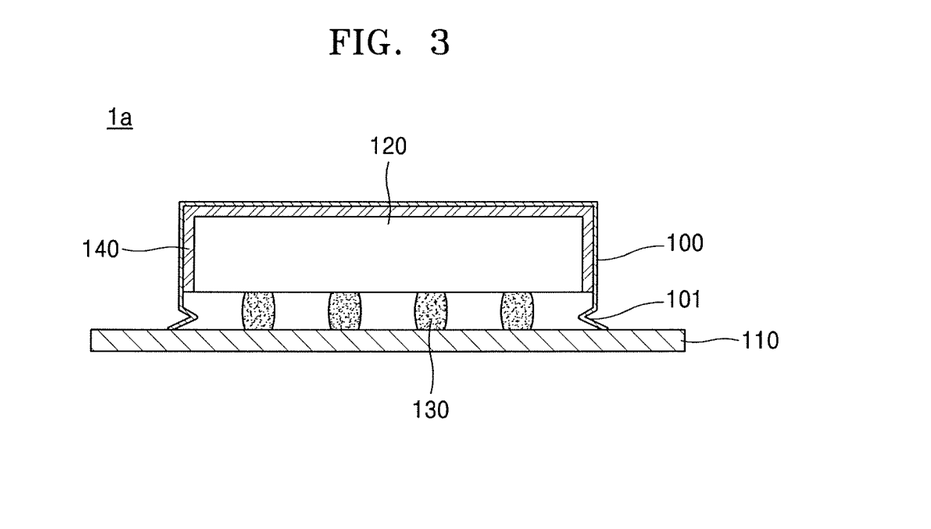
FIG. 3 is a cross-sectional view illustrating a semiconductor package according to an exemplary embodiment of the present inventive concept.

FIG. 3 is a cross-sectional view illustrating a semiconductor package 1a according to an exemplary embodiment of the present inventive concept.

Referring to FIG. 3, the semiconductor package 1a may include a semiconductor chip 120, a package substrate 110 on which the semiconductor chip 120 is mounted, an electromagnetic wave shielding member 100, and a thermal interface material 140 interposed between the semiconductor chip 120 and the electromagnetic wave shielding member 100.

The thermal interface material 140 may be interposed between the semiconductor chip 120 and the electromagnetic wave shielding member 100 to cover both an upper surface and side surfaces of the semiconductor chip 120. However, exemplary embodiments of the present inventive concept are not limited thereto. The thermal interface material 140 may be formed by using a paste method, inkjet printing, or a spin coating method.

The thermal interface material 140 may be a material promoting a transmission of heat, which is generated from the semiconductor chip 120, to an outside of the semiconductor package I a. The thermal interface material 140 may be, for example, grease, a heat conductive adhesive, mineral oil, a gel or a pad formed of a phase-change material, or a particle-filled epoxy. For example, commercially obtainable grease may be ShinEtsu G750, ShinEtsu G751, ShinEtsu G765 or Berquist TIC-7500. A phase-change material may be, for example, Thermax HF60110-BT, Chromerics T725, Chromerics T443, Chromerics T454, Thermagon T-pcm 905c, Berquist 200U, Berquist HiFlow 225-U or Berquist HiFlow 225-UT. A heat conductive adhesive may be, for example, Chromerics therm-A-form T642. However, exemplary embodiments of the present inventive concept are not limited thereto.

Figure 4:
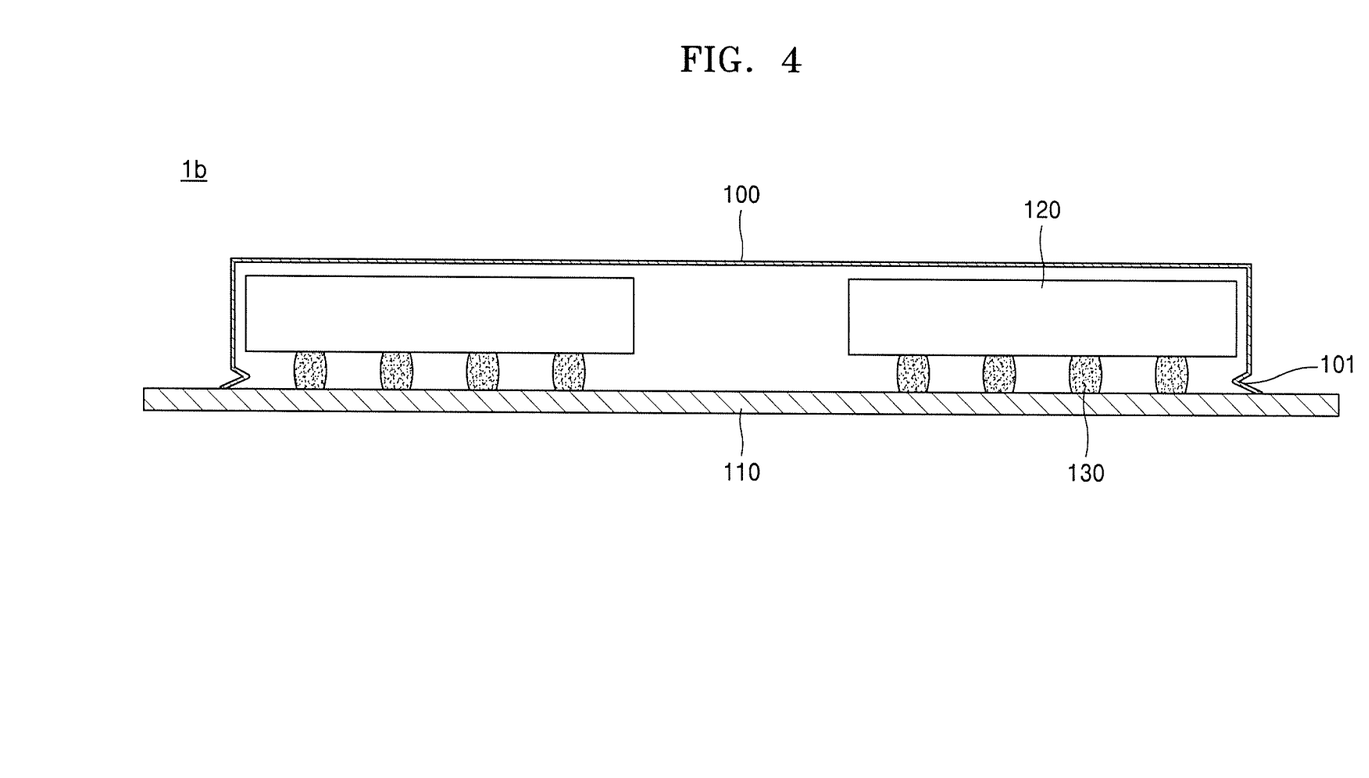
FIG. 4 is a cross-sectional view illustrating a semiconductor package according to an exemplary embodiment of the present inventive concept.

FIG. 4 is a cross-sectional view illustrating a semiconductor package 1b according to an exemplary embodiment of the present inventive concept.

Referring to FIG. 4, the semiconductor package 1b may include a plurality of semiconductor chips 120, a package substrate 110 on which the semiconductor chips 120 are mounted, and an electromagnetic wave shielding member 100 surrounding the semiconductor chips 120. The semiconductor chips 120 are horizontally arranged on an identical plane on the package substrate 110, but the semiconductor chips 120 are not limited thereto, and may be laminated in a chip on chip (COC) structure.

Figure 5:
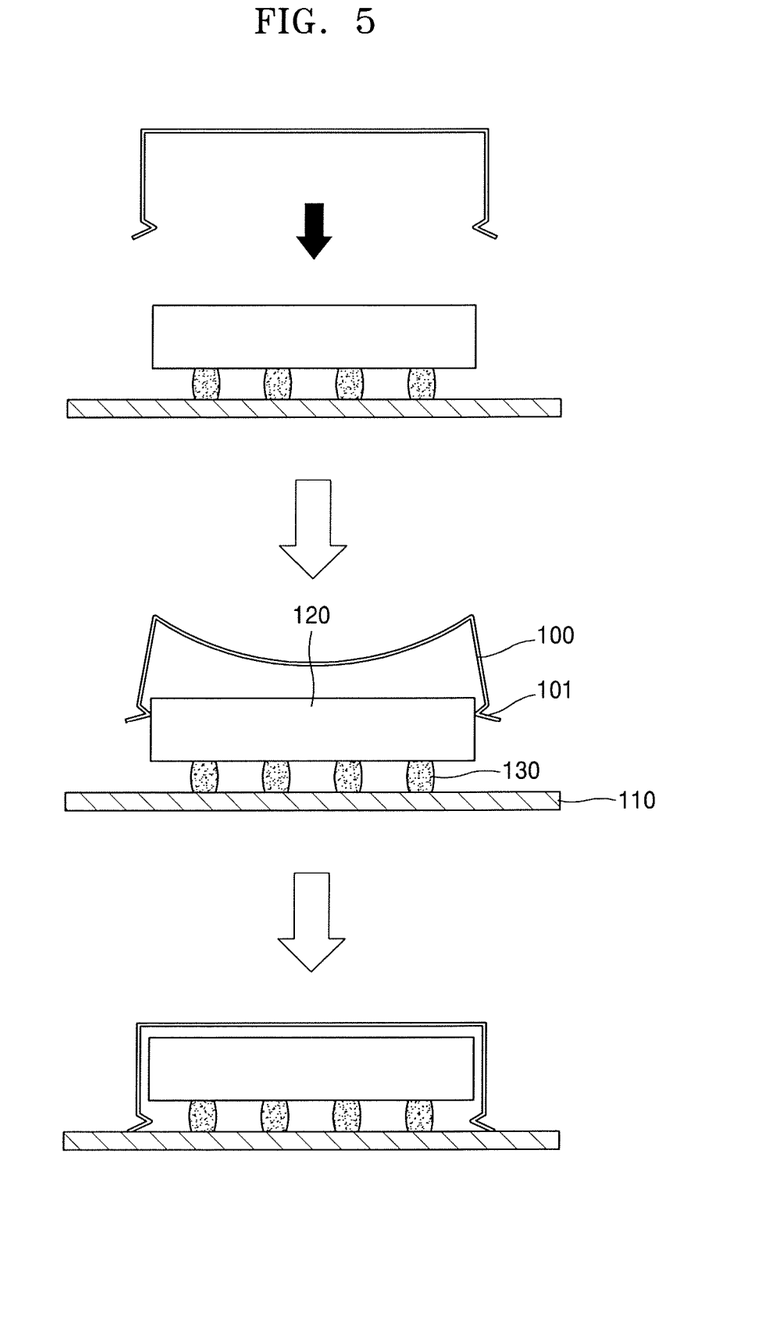
FIG. 5 is a flowchart of method of manufacturing a semiconductor package, according to an exemplary embodiment of the present inventive concept.

FIG. 5 is a flowchart of an operation of manufacturing a semiconductor package, according to an exemplary embodiment of the present inventive concept.

Referring to FIG. 5, the method of manufacturing the semiconductor package includes a semiconductor chip 120, a package substrate 110 on which the semiconductor chip 120 is mounted, a semiconductor package including a bump 130 electrically connecting the semiconductor chip 120 and the package substrate 110, and an electromagnetic wave shielding member 100. The electromagnetic wave shielding member 100 may be formed of an elastically deformable metal or a bendable metal. Since a split is between each side surface of the electromagnetic wave shielding member 100 formed of elastically deformable metal, the electromagnetic wave shielding member 100 may extend in a horizontal direction when a force is applied to the side surfaces thereof. Therefore, the electromagnetic wave shielding member 100 may be deformed without a separate process facility and may be assembled to the semiconductor package. After the electromagnetic wave shielding member 100 is assembled to the semiconductor package, the electromagnetic wave shielding member 100 may be fixed to the semiconductor package by a hooking member 101 which is a deformation of a lower end of the electromagnetic wave shielding member 100.

Figure 6A:
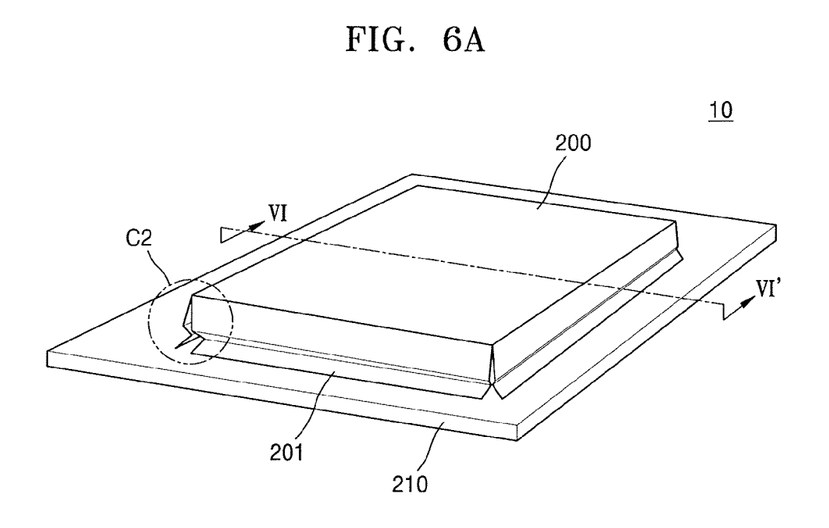
FIG. 6A is a perspective view illustrating a semiconductor device according to an exemplary embodiment of the present inventive concept.
Figure 6B:
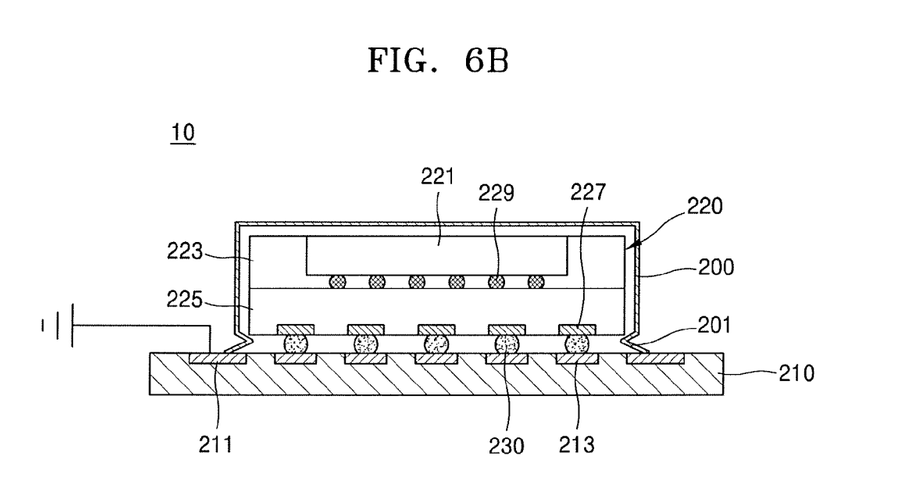
FIG. 6B is a cross-sectional view, taken along a line VI-VI' of FIG. 6A, illustrating a semiconductor device according to an exemplary embodiment of the present inventive concept.

FIG. 6A is a perspective view illustrating a semiconductor device 10 according to an exemplary embodiment of the present inventive concept. FIG. 6B is a cross-sectional view, taken along a line VI-VI' of FIG. 6A, according to an exemplary embodiment of the present inventive concept.

Referring to FIGS. 6A and 6B, the semiconductor device 10 may include a semiconductor package 220, a first substrate 210 on which the semiconductor package 220 is mounted, and an electromagnetic wave shielding member 200 surrounding an upper surface and side surfaces of the semiconductor package 220, according to an exemplary embodiment of the present inventive concept.

The first substrate 210 may include a grounding pad 211 and a first pad 213. The first pad 213 may be disposed in an upper surface of the first substrate 210 and is electrically contacting the semiconductor package 220.

A part C2 of the side surfaces of the electromagnetic wave shielding member 200, in which the side surfaces surround side surfaces of the semiconductor package 220, may be split. Furthermore, a hooking member 201 may be interposed between the semiconductor package 220 and the first substrate 210 with space between one another, so that the hooking member 201 may fix (e.g., secure) the electromagnetic wave shielding member 200.

The semiconductor package 220 may include a second substrate 225, a semiconductor chip 221 mounted on an upper surface of the second substrate 225, a mold member 223 covering the upper surface of the second substrate 225 and side surfaces of the semiconductor chip 221. The semiconductor package 220 may further include a bump 229 electrically connecting the second substrate 225 and the semiconductor chip 221, a solder ball 230 attached to a lower surface of the second substrate 225, and a second pad 227 electrically connected to the solder ball 230. The solder ball 230 may electrically connect the first pad 213 disposed in an upper surface of the first substrate 210 and the second pad 227 disposed in a lower surface of the second substrate 225.

The semiconductor package 220 may include only one semiconductor package on the first substrate 210 as illustrated in FIG. 6B. However, exemplary embodiments of the present inventive concept are not limited thereto. The semiconductor package 220 may have a package on package (POP) structure laminating a plurality of semiconductor packages. Furthermore, a plurality of semiconductor packages may be horizontally mounted on an identical horizontal plane. For example, the plurality of semiconductor packages may be horizontally mounted on the first substrate 210.

The semiconductor chip 221, for example, may be a semiconductor memory chip. The semiconductor memory chip may be, for example, a semiconductor volatile memory chip such as a DRAM or a SRAM, or a semiconductor nonvolatile memory chip such as a PRAM, an MRAM, an FeRAM or a RRAM.

The first and second substrates 210 and 225 may be, for example, a PCB. The PCB may be a single-sided or double-sided PCB, or may be a multi-layer PCB including at least one internal wiring pattern in a substrate. Furthermore, the first and second substrates 210 and 225 may be a rigid PCB or a flexible PCB.

In exemplary embodiments of the present inventive concept, the first and second substrates 210 and 225 may include, for example, an epoxy resin, a polyimide resin, a BT resin, FR-4, FR-5, ceramics, silicon, glass, photosensitive liquid dielectrics, photosensitive dry-film dielectrics, polyimide flexible film thermally cured dry films, thermally cured liquid dielectrics, an RCC, thermoplastics, or a flexible resin.

In exemplary embodiments of the present inventive concept, the first and second substrates 210 and 225 may be formed by adhering a plurality of rigid flat panels together or by adhering a thin flexible PCB and a rigid flat panel together. The plurality of rigid flat panels adhered to one another or to PCBs may respectively include wiring patterns. Furthermore, each of the first and second substrates 210 and 225 may include an LTCC substrate. A plurality of ceramic layers may be laminated on the LTCC substrate and may include wiring patterns therein.

The first and second substrates 210 and 225 may each include at least one insulating layer and at least one metal wiring layer. The metal wiring layer, which is a circuit pattern disposed in each of the first and second substrates 210 and 225, may be formed of, for example, Al or Cu. In exemplary embodiments of the present inventive concept, a surface of the metal wiring layer may be plated with Sn, Au, Ni, or Pb.

The bump 229 may electrically connect a through-silicon via (TSV) of an inner substrate of the semiconductor chip 221 and an upper pad of the second substrate 225. The upper pad may be disposed in, for example, an upper surface of the second substrate 225. The bump 229 may be formed of a conductive material, for example, Cu, Al, silver (Ag), Sn, Au or Pb. However, a material forming the bump 229 is not limited thereto.

The mold member 223, which covers and protects the semiconductor chip 221 and the bump 229, may be formed of various synthetic resins including, for example, an epoxy resin, a curing agent or an organic/inorganic filling material. The mold member 223 may be injection-molded in a mold. The mold member 223 may be formed of a polymer such as a resin. For example, the mold member 223 may be formed of an Epoxy Molding Compound (EMC).

However, the mold member 223 is not limited to the above materials or the above method. For example, the mold member 223 may be formed by a Molded Under-Fill (MUF) process. The MUF process describes a process of filling a space between the semiconductor chip 221, which is mounted on the second substrate 225, and the second substrate 225 with the mold member 223 without separately filling the space with an underfill. When the mold member 223 is formed by the MUF process, a material forming a mold member covering a contour of the semiconductor chip 221 may be the same a material forming a mold member between the semiconductor chip 221 and the second substrate 225.

However, in an exemplary embodiment of the present inventive concept, the mold member 223 may be formed without the MUF process. For example, the mold member 223 may be formed by filling the space between the semiconductor chip 221 and the second substrate 225 with an underfill, and by covering the contour of the semiconductor chip 221 with an external mold member. A material forming the underfill filling the space between the semiconductor chip 221 and the second substrate 225 may be the same as or different from the material forming the external mold member covering the contour of the semiconductor chip 221.

The electromagnetic wave shielding member 200 may be formed of an elastically deformable metal. For example, the electromagnetic wave shielding member 200 may be formed of a conductive metal material, such as SUS or Al. The electromagnetic wave shielding member 200 may include an upper surface including a size corresponding to that of the semiconductor package 220, and side surfaces extending from an edge of the upper surface and providing a constant height.

The hooking member 201, which is bent inside and toward the semiconductor package 220, may be located at a lower end of one of the side surfaces of the electromagnetic wave shielding member 200. Further, an edge of the deformed hooking member 201 may contact the grounding pad 211 of the first substrate 210. The grounding pad 211 may be disposed in the upper surface of the first substrate 210. Accordingly, the electromagnetic wave shielding member 200 may be connected to a ground terminal outside the semiconductor package 10 via the grounding pad 211. Thus, electromagnetic wave shielding performance may be further improved.

A part C2 of the side surfaces of the electromagnetic wave shielding member 200, in which the side surfaces surround side surfaces of the semiconductor package 220, may be split. For example, the upper surface of the electromagnetic wave shielding member 200 formed over the semiconductor package 220 is square shaped (e.g. a polygonal shape). Further in the example, the electromagnetic wave shielding member 200 may include the split C2 between adjacent side surfaces among the four side surfaces extending from the edges of the upper surface of the electromagnetic wave shielding member 200. Further, the four side surfaces are connected to the upper surface of the electromagnetic wave shielding member 200. However, the present inventive concept is not limited thereto.

The solder ball 230 may be formed of, for example, Pb, Sn, an alloy of Pb and Sn, Ag, Cu or Al, and may be formed by a soldering device. However, the solder ball 230 is not limited to the above materials or being formed by the above method.

The semiconductor chip 221 and the semiconductor package 220 of FIG. 6B are respectively mounted on the first and second substrates 210 and 225 by using a flip-chip bonding method, but a mounting method of the semiconductor chip 221 is not limited thereto. For example, the semiconductor chip 221 may be mounted on the second substrate 225 by using a wire-bonding method. Further, multiple semiconductor chips 221 may be horizontally arranged at a same level as the second substrate 225, or may be laminated in a COC structure.

Figure 7:
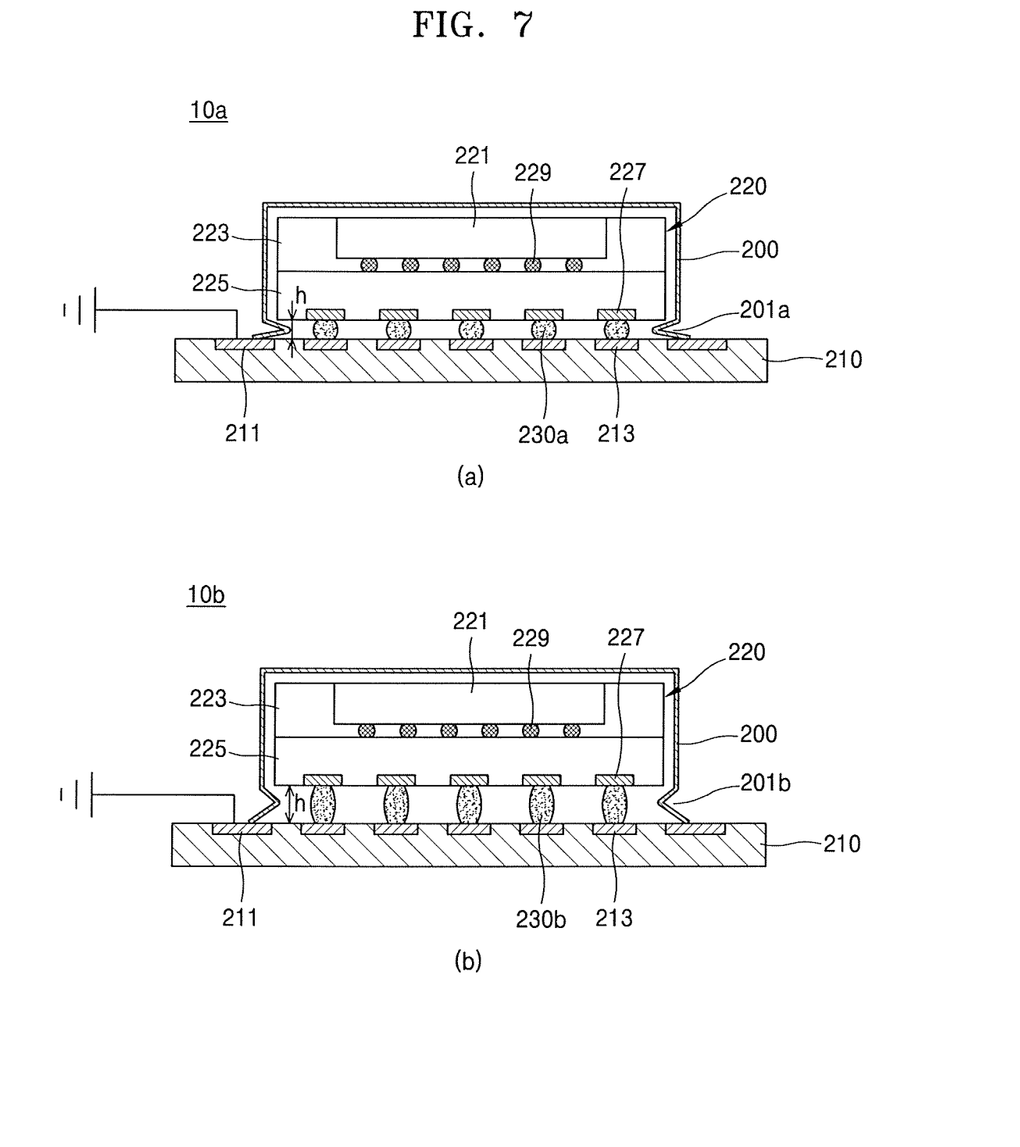
FIG. 7 is a cross-sectional view illustrating a semiconductor device according to an exemplary embodiment of the present inventive concept.

FIG. 7 is a cross-sectional view illustrating a semiconductor device according to an exemplary embodiment of the present inventive concept. FIG. 7(*a*) is a cross-sectional view illustrating a semiconductor device 10*a* when a height h of a space between a semiconductor package 220 and a first substrate 210 is less than a height h of a space between a semiconductor package 220 and a first substrate 210 of FIG. 7(*b*). FIG. 7(*b*) is a cross-sectional view illustrating a semiconductor device 10*b* when the height h of the space between the semiconductor package 220 and the first substrate 210 is larger than the height h of the space between the semiconductor package 220 and the first substrate 210 of FIG. 7(*a*).

Referring to FIG. 7(*a*), when the height h of the space between the semiconductor package 220 and the first substrate 210 is relatively less than that of FIG. 7(*b*), a height of a solder ball 230*a* may also be less than a height of a solder ball 230*b* of FIG. 7(*b*). Here, a deformation degree of a hooking member 201*a* may be relatively greater than a deformation degree of a hooking member 201*b* of FIG. 7(*b*). In addition, the hooking member 201*a* may be located in a narrow space, which is an efficient location, and the electromagnetic wave shielding member 200 may be prevented from being easily separated from the semiconductor device 10*a*.

Referring to FIG. 7(*b*), when the height h of the space between the semiconductor package 220 and the first substrate 210 is relatively larger than that of FIG. 7(*a*), the height of the solder ball 230*b* may also be larger than the height of the solder ball 230*b* of FIG. 7(*a*). Here, the deformation degree (e.g., an angle) of the hooking member 201*b* may be relatively less than the deformation degree (e.g., an angle) of the hooking member 201*a* of FIG. 7(*a*). For example, the hooking member 201*b* may be bent at an angle that is greater than that of the hooking member 201*a* of FIG. 7(*a*).

However, this is only an example, and the electromagnetic wave shielding member 200 may be set to be firmly fixed in the semiconductor device 10*a* or 10*b*, by adjusting a deformation degree of the hooking member 201 of the electromagnetic wave shielding member 200. The adjustment to the deformation degree of the hooking member 201 may be according to the height h of the space between the semiconductor package 220 and the first substrate 210 or a size of the semiconductor package 220.

Figure 8:
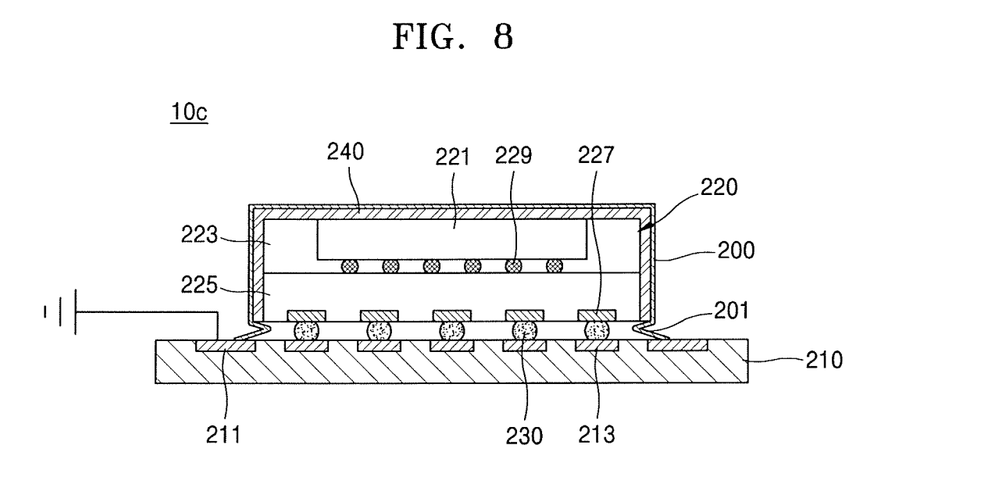
FIG. 8 is a cross-sectional view illustrating a semiconductor device according to an exemplary embodiment of the present inventive concept.

FIG. 8 is a cross-sectional view illustrating a semiconductor device 10*c* according to an exemplary embodiment of the present inventive concept.

Referring to FIG. 8, the semiconductor device 10*c* may include a semiconductor package 220, a first substrate 210 on which the semiconductor package 220 is mounted, an electromagnetic wave shielding member 200 surrounding an upper surface and side surfaces of the semiconductor package 220, and an insulating member 240, according to an exemplary embodiment of the present inventive concept.

The insulating member 240 may be disposed between the semiconductor package 220 and the electromagnetic wave shielding member 200. For example, the insulating member 240 may cover both an upper surface and side surfaces of the semiconductor package 220 but is not limited thereto. For example, the insulating member 240 may cover only an upper surface of the semiconductor package 220, or may be disposed only on a contacting side of the semiconductor package 220 and the electromagnetic wave shielding member 200.

The insulating member 240 is to prevent damage incurred by the semiconductor package 220 and the electromagnetic wave shielding member 200 electrically connecting when they directly contact one another. Here, the insulating member 240 may be an adhesive. For example, the insulating member 240 may be formed of a non-conductive film (NCF) or a non-conductive paste (NCP). The NCF is a normal insulating adhesive film.

Figure 9:
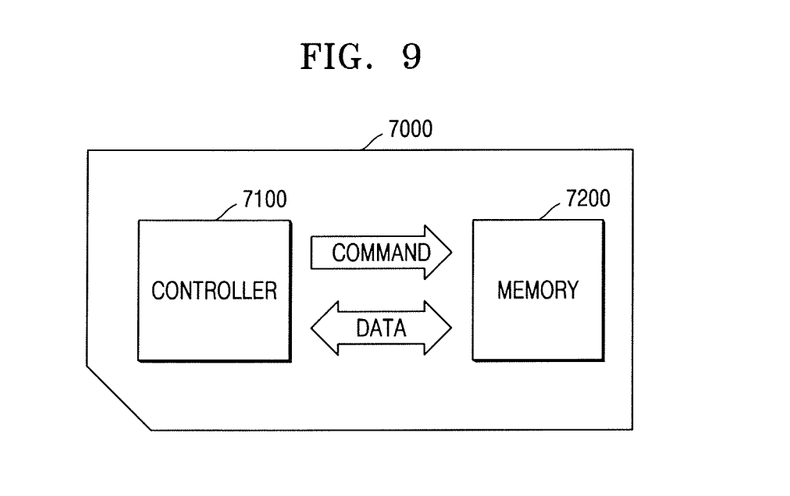
FIG. 9 is a schematic block diagram illustrating a memory card including a semiconductor package or a semiconductor device, according to exemplary embodiments of the present inventive concept.

FIG. 9 is a schematic block diagram illustrating a memory card 7000 including a semiconductor package or a semiconductor device, according to exemplary embodiments of the present inventive concept.

Referring to FIG. 9, a controller 7100 and a memory 7200 may be arranged in the memory card 7000 to exchange an electrical signal. For example, when the controller 7100 sends a command to the memory 7200, the memory 7200 may transmit data to the controller 7100. The controller 7100 and/or the memory 7200 may include a semiconductor package 1, 1a, and 1b of FIGS. 1A, 1B, 3, and 4, or a semiconductor device 10, 10a, 10b and 10c of FIGS. 6A and 6B, 7, and 8 according to an exemplary embodiment of the present inventive concept. The memory 7200 may include a memory array or a memory array bank.

The memory card 7000 may be used as various kinds of memory cards, for example, a memory device such as a memory stick card, a smart media card (SM), a secure digital card (SD), a mini secure digital card (mini SD), or a multimedia card (MMC).

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor package comprising:
   a semiconductor chip mounted on a substrate;
   an electromagnetic wave shielding member comprising an upper surface and a plurality of side surfaces, wherein the electromagnetic wave shielding member surrounds an upper surface and side surfaces of the semiconductor chip; and
   a hooking member formed from a deformation of a lower end of one of the side surfaces of the electromagnetic wave shielding member, wherein
   the hooking member is interposed between the semiconductor chip and the substrate to fix the electromagnetic wave shielding member.

2. The semiconductor package of claim 1, wherein side surfaces of the electromagnetic wave shielding member surround the side surfaces of the semiconductor chip, and a portion of the electromagnetic wave shielding member comprises a split between the side surfaces of the electromagnetic wave shielding member.

3. The semiconductor package of claim 1, wherein an upper surface of the electromagnetic wave shielding member disposed over the semiconductor chip is square shaped, and
   the electromagnetic wave shielding member comprises four side surfaces that are connected to the upper surface of the electromagnetic wave shielding member, and splits between adjacent side surfaces among the four side surfaces of the electromagnetic wave shielding member.

4. The semiconductor package of claim 1, wherein the hooking member of the electromagnetic wave shielding member contacts a ground region disposed on an upper surface of the substrate.

5. The semiconductor package of claim 1, further comprising a thermal interface material interposed between the semiconductor chip and the electromagnetic wave shielding member.

6. The semiconductor package of claim 5, wherein the thermal interface material covers both the upper surface and the side surfaces of the semiconductor chip.

7. The semiconductor package of claim 1, further comprising:
   a bump electrically connecting the semiconductor chip and the package substrate, wherein the electromagnetic wave shielding member is spaced apart from the bump.

8. The semiconductor package of claim 1, wherein the electromagnetic wave shielding member surrounds a plurality of semiconductor chips.

9. A semiconductor device comprising:
   a semiconductor package comprising a semiconductor chip;
   a first substrate, wherein the semiconductor package is mounted thereon, comprising a grounding pad in an upper surface thereof; and
   an electromagnetic wave shielding member comprising an upper surface and a plurality of side surfaces, wherein the electromagnetic wave shielding member surrounds an upper surface and side surfaces of the semiconductor package,
   wherein side surfaces of the electromagnetic wave shielding member surround side surfaces of the semiconductor chip,
   a portion of the electromagnetic wave shielding member comprises a split between the side surfaces of the electromagnetic wave shielding member, and
   the electromagnetic wave shielding member comprises a hooking member interposed between the semiconductor package and the first substrate and configured to fix the electromagnetic wave shielding member.

10. The semiconductor device of claim 9, wherein the electromagnetic wave shielding member is formed of an elastically deformable metal.

11. The semiconductor device of claim 9, wherein the hooking member is a deformation of a lower end of one of the side surfaces of the electromagnetic wave shielding member.

12. The semiconductor device of claim 11, wherein an edge of the hooking member contacts the grounding pad of the first substrate.

13. The semiconductor device of claim 11, wherein a deformation degree of the hooking member is adjustable based on a height of a space between the semiconductor package and the first substrate, or a size of the semiconductor package.

14. The semiconductor device of claim 9, further comprising an insulating member between the semiconductor package and the electromagnetic wave shielding member.

15. The semiconductor device of claim 13, wherein the semiconductor package comprises:
   a second substrate, wherein the semiconductor chip is mounted thereon; and
   a mold member covering the semiconductor chip.

16. A semiconductor package comprises:
   a substrate;
   a bump disposed on the substrate;
   a semiconductor chip disposed on the bump; and
   an electromagnetic wave shielding member enclosing the semiconductor chip and comprising:
      a bent lower end of at least one side surface of the electromagnetic wave shielding member, wherein the bent lower end includes a bend overlapping a bottom portion of the semiconductor chip; and
      a space between adjacent side surfaces of the electromagnetic wave shielding member.

17. The semiconductor package of claim 16, wherein an angle of the bend is adjustable.

18. The semiconductor package of claim 16, wherein a ground region is disposed on an upper surface of the substrate and is in contact with the bent lower end.

19. The semiconductor package of claim 18, wherein the bent lower end includes a lower section extending from the bend, wherein the lower section is in contact with the ground region and forms an angle with the ground region greater than zero.

20. The semiconductor package of claim 16, wherein the electromagnetic wave shielding member is formed of a bendable metal.

\* \* \* \* \*